(12) United States Patent
Huang et al.

(10) Patent No.: US 9,391,287 B1
(45) Date of Patent: Jul. 12, 2016

(54) PHOTOVOLTAIC PEROVSKITE MATERIAL AND METHOD OF FABRICATION

(71) Applicant: The Board of Regents of the University of Nebraska, Lincoln, NE (US)

(72) Inventors: Jinsong Huang, Lincoln, NE (US); Qingfeng Dong, Lincoln, NE (US); Rui Dong, Lincoln, NE (US); Yuchuan Sao, Lincoln, NE (US); Cheng Bi, Lincoln, NE (US); Qi Wang, Lincoln, NE (US); Zhengguo Xiao, Lincoln, NE (US)

(73) Assignee: THE BOARD OF REGENTS OF THE UNIVERSITY OF NEBRASKA, Lincoln, NE (US)

( * ) Notice: Subject to any disclaimer, the term of this patent is extended or adjusted under 35 U.S.C. 154(b) by 0 days.

(21) Appl. No.: 14/576,878

(22) Filed: Dec. 19, 2014

Related U.S. Application Data

(60) Provisional application No. 61/918,330, filed on Dec. 19, 2013.

(51) Int. Cl.
| | |
|---|---|
| *H01L 51/42* | (2006.01) |
| *H01L 51/44* | (2006.01) |
| *H01L 51/00* | (2006.01) |

(52) U.S. Cl.
CPC .......... *H01L 51/4213* (2013.01); *H01L 51/442* (2013.01); *H01L 51/005* (2013.01); *H01L 51/0037* (2013.01)

(58) Field of Classification Search
CPC .............. H01L 51/4213; H01L 51/442; H01L 51/0037; H01L 51/005
See application file for complete search history.

(56) References Cited

U.S. PATENT DOCUMENTS

2014/0332078 A1* 11/2014 Guo et al. ............. 136/261
2015/0318477 A1* 11/2015 Irwin ............. H01L 51/0003
556/35

OTHER PUBLICATIONS

Kim et al., "Lead Iodide Perovskite Sensitized All-Solid-Sate Submicron Thin Film Mesocopic Solar Cell with Efficiency Exceeding 9%", Scientific Reports, 2:591, Aug. 2, 2012, pp. 1-8.*
Kojima et al., "Organometal Halide Perovskites as Visible-Light Sensitizers for Photovoltaic Cells", Journal of the American Chemical Society, vol. 131, Apr. 14, 2009, pp. 6050-6051.*
Liu et al., "Efficient planar heterojunction perovskite solar ceslls by vapour deposition", Nature, Macmillan Publishers, vol. 501, Sep. 19, 2013, pp. 395-398.*
Lee et al., "Efficient Hybrid Solar Cells Based on Meso-Superstructured Organometal Halide Perovskites", Science, vol. 338, Nov. 2, 2012, pp. 643-647.*

* cited by examiner

*Primary Examiner* — William Coleman
(74) *Attorney, Agent, or Firm* — Leydig, Voit & Mayer, LTD

(57) ABSTRACT

A semiconductor device and a method for fabrication of the semiconductor device are described that include a perovskite layer formed using a solution process with lead iodine and methylammonium halide. In an implementation, a semiconductor device that employs example techniques in accordance with the present disclosure includes a cathode layer; an anode layer; and an active layer disposed between the cathode layer and the anode layer, where the active layer includes a perovskite layer including an interdiffused and annealed lead iodine ($PbI_2$) film and methylammonium halide ($CH_3NH_3X$) film. In implementations, a process for fabricating a continuous-perovskite semiconductor device that employs example techniques in accordance with the present disclosure includes spinning a $PbI_2$ layer onto an ITO-covered glass; spinning an MAI layer onto the $PbI_2$ layer; annealing the $PbI_2$ layer and the MAI layer; spinning a PCBM layer onto a resulting perovskite layer; and depositing an Al layer.

23 Claims, 7 Drawing Sheets

PHOTOVOLTAIC PEROVSKITE MATERIAL AND METHOD OF FABRICATION

CROSS-REFERENCE TO RELATED APPLICATIONS

The present application claims the benefit under 35 U.S.C. §119(e) of U.S. Provisional Application Ser. No. 61/918,330, filed Dec. 19, 2013, and titled "METHODS OF FABRICATION HIGH EFFICIENCY PEROVSKITE MATERIALS AND SOLAR CELLS BY SOLUTION PROCESS." U.S. Provisional Application Ser. No. 61/918,330 is herein incorporated by reference in its entirety.

FEDERALLY SPONSORED RESEARCH OR DEVELOPMENT

This invention was made with Government support under contracts ECCS-1201384 and ECCS-1252623 awarded by the National Science Foundation and under contract N000141210556 awarded by the Office of Naval Research. The Government has certain rights in this invention.

BACKGROUND

The Sun deposits 120,000 terawatts (TW) of power onto the Earth's surface. This is more than the 13 TW of total power that is currently used by the planet's population. Photovoltaics (PV) convert solar energy into direct current electricity using semiconducting materials that exhibit the photovoltaic effect. The photovoltaic effect includes photons of light exciting electrons into a higher state of energy, allowing them to act as charge carriers for an electric current. A photovoltaic system can employ solar panels including a number of solar cells to supply usable solar power.

SUMMARY

A semiconductor device and a method for fabrication of the semiconductor device are described that include a perovskite layer formed using a solution process with lead (II) iodide and methylammonium halide. In implementations, a semiconductor device may include devices such as photovoltaic devices, light emitting diodes, photodetectors, transistors, radiation sensors, solar cells, memristors, and so forth. In an implementation, a semiconductor device that employs example techniques in accordance with the present disclosure includes a cathode layer; an anode layer; and an active layer disposed between the cathode layer and the anode layer, where the active layer includes a perovskite layer including an interdiffused and annealed lead (II) iodide ($PbI_2$) film and methylammonium halide ($CH_3NH_3X$) film. In one implementation, a process for fabricating a continuous-perovskite semiconductor device that employs example techniques in accordance with the present disclosure includes spin coating a $PbI_2$ layer onto an ITO-covered glass; spinning an MAI layer onto the $PbI_2$ layer; annealing the $PbI_2$ layer and the MAI layer; spinning a PCBM layer onto a resulting perovskite layer; and depositing an Al layer.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

DRAWINGS

The detailed description is described with reference to the accompanying figures. The use of the same reference numbers in different instances in the description and the figures may indicate similar or identical items.

FIG. 1A is a cross section side view illustrating an embodiment of a semiconductor device with an active layer disposed between the substrate (e.g., glass layer, anode layer) and the cathode layer, where the active layer includes a perovskite layer including an interdiffused and annealed lead (II) iodide ($PbI_2$) film and methylammonium halide ($CH_3NH_3X$) film, in accordance with an example implementation of the present disclosure.

FIG. 1B is a partial isometric view illustrating an embodiment of a semiconductor device having an inverted configuration with an active layer disposed between the substrate (e.g., glass layer, cathode layer) and the anode layer, where the active layer includes a perovskite layer including an interdiffused and annealed lead (II) iodide ($PbI_2$) film and methylammonium halide ($CH_3NH_3X$) film, in accordance with an example implementation of the present disclosure.

FIG. 2 is a cross section side view illustrating an embodiment of a semiconductor device with an active layer disposed between the substrate and the anode layer, where the active layer includes a perovskite layer including an interdiffused and annealed lead (II) iodide ($PbI_2$) film and methylammonium halide ($CH_3NH_3X$) film, in accordance with an example implementation of the present disclosure.

DETAILED DESCRIPTION

Overview

Figure 1A:
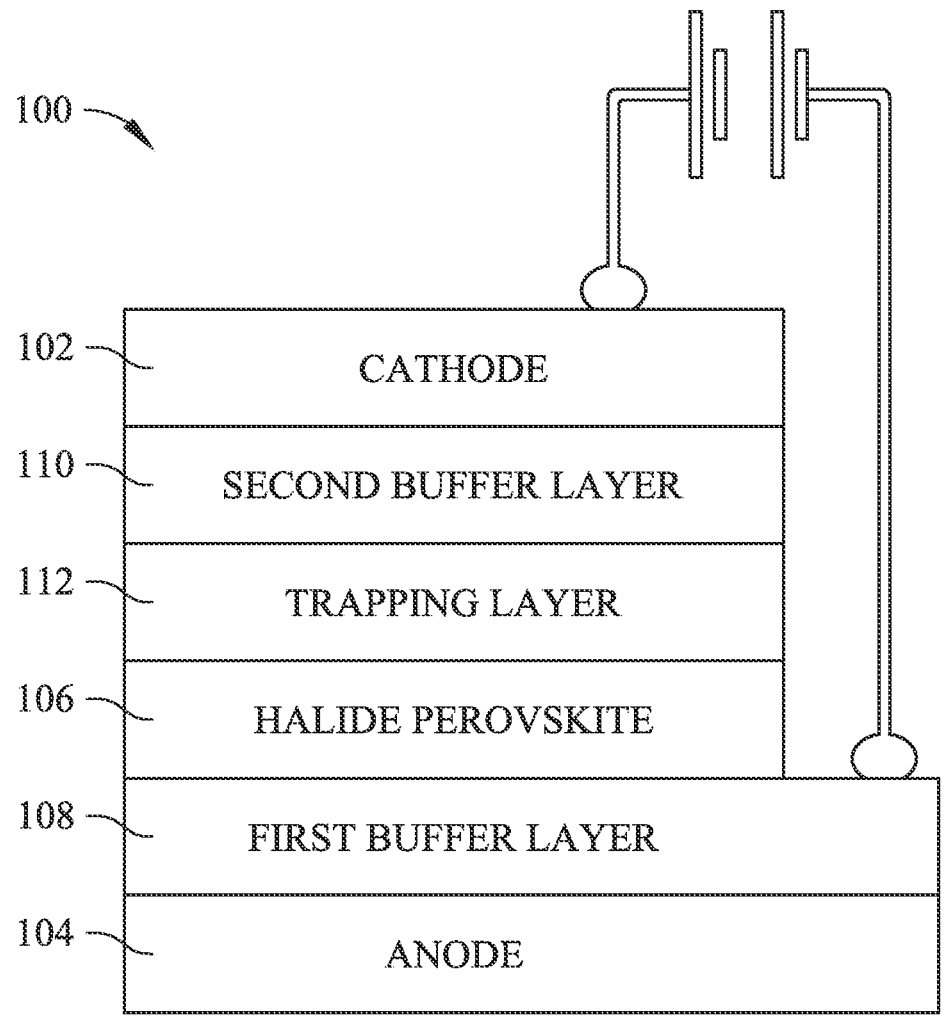

Organometal trihalide perovskites ($CH_3NH_3PbX_3$, X=Cl, Br, I or a mixed halide) can be excellent low-cost, earth-abundant photovoltaic materials after organic semiconductors and quantum dots material due to proper bandgap, excellent crystallinity, and strong absorption. In addition, $CH_3NH_3PbX_3$ has intriguing optoelectronic properties, such as a very large carrier mobility comparable to silicon, bipolar transport, and large charge carrier diffusion length, which enables high performance devices with the traditional planar heterojunction (PHJ) structure.

Perovskite photovoltaic devices (PPVs) have been demonstrated to have all the desired properties of organic photo voltaic devices (OPVs), which have strong market potential in military and civilian applications, including for flexible, wearable, lightweight, and portable chargers for electronics, building-integrated photovoltaics (BIPVs), and off-grid power generation. PPVs have shown all three main competencies of OPVs over other photovoltaic technologies: 1) PPVs can be made on flexible plastic substrates; 2) PPVs can be fabricated with low cost materials and a solution process; 3) Perovskite materials have tunable color and bandgaps with semitransparency, which would allow for the integration of PPVs into buildings. State-of-the-art PPV devices can have an efficiency of 20%, but they need to reach 25% to compete with other commercialized thin film solar cell technologies in order to make them commercially viable. The thermodynamic efficiency limit of single junction PPVs can be 38% based on its bandgap.

High mobility and lifetime is important for photonic devices because the light-generated electrons and holes can move longer distances to be extracted as current, thus avoiding release their energy as heat within the recombination. High mobility and high carrier lifetimes are also crucial for photo detectors. For example, in an organic/inorganic hybrid photo detector, if one type of carriers (e.g., electrons) can be trapped longer, the other type of carriers (e.g., holes) thus can circle many times with high mobility through the polymer matrix or network. In this case, ultra-high gain (gain may be defined by the ratio of the lifetime of the trapped electrons and the transit time of holes), can be obtained.

Despite the high efficiency reported in devices fabricated by thermal evaporation, the complicated controlling of the non-stoichiometry of $CH_3NH_3PbI_{3-x}Cl_x$ by the co-evaporation under high vacuum dims its advantage of being low cost. Low temperature solution processes are attractive in the fabrication of electronic devices, especially large-area solar cells, for reducing fabrication cost. However, it is challenging to form large-area pinhole-free lead halide perovskite thin films by spin-coating from solution of pre-mixed precursors. The power conversion efficiency of low-temperature solution-processed perovskite devices in the range of 4-11% can be far below devices with mesoporous structure devices and prepared by thermal evaporation. There are also concerns that the use of lead, a toxic element, may be a potential hazard.

Accordingly, a semiconductor device and a method for fabrication of the semiconductor device are described that include a perovskite layer formed using a solution process with lead (II) iodide and a methylammonium halide. In an implementation, a semiconductor device that employs example techniques in accordance with the present disclosure includes a cathode layer; an anode layer; and an active layer disposed between the cathode layer and the anode layer, where the active layer includes a perovskite layer including an interdiffused and annealed lead (II) iodide ($PbI_2$) film and methylammonium halide (CH3NH3X) film. In implementations, a process for fabricating a continuous-perovskite semiconductor device that employs example techniques in accordance with the present disclosure includes spinning a PbI2 layer onto an ITO-covered glass; spinning an MAI layer onto the PbI2 layer; annealing the PbI2 layer and the MAI layer; spinning a PCBM layer onto a resulting perovskite layer; and depositing an Al layer. In other implementations, a process can include spin coating a pre-mixed perovskite layer precursor onto a glass layer, an anode layer, and/or a cathode layer.

Example Implementations

Figure 1B:
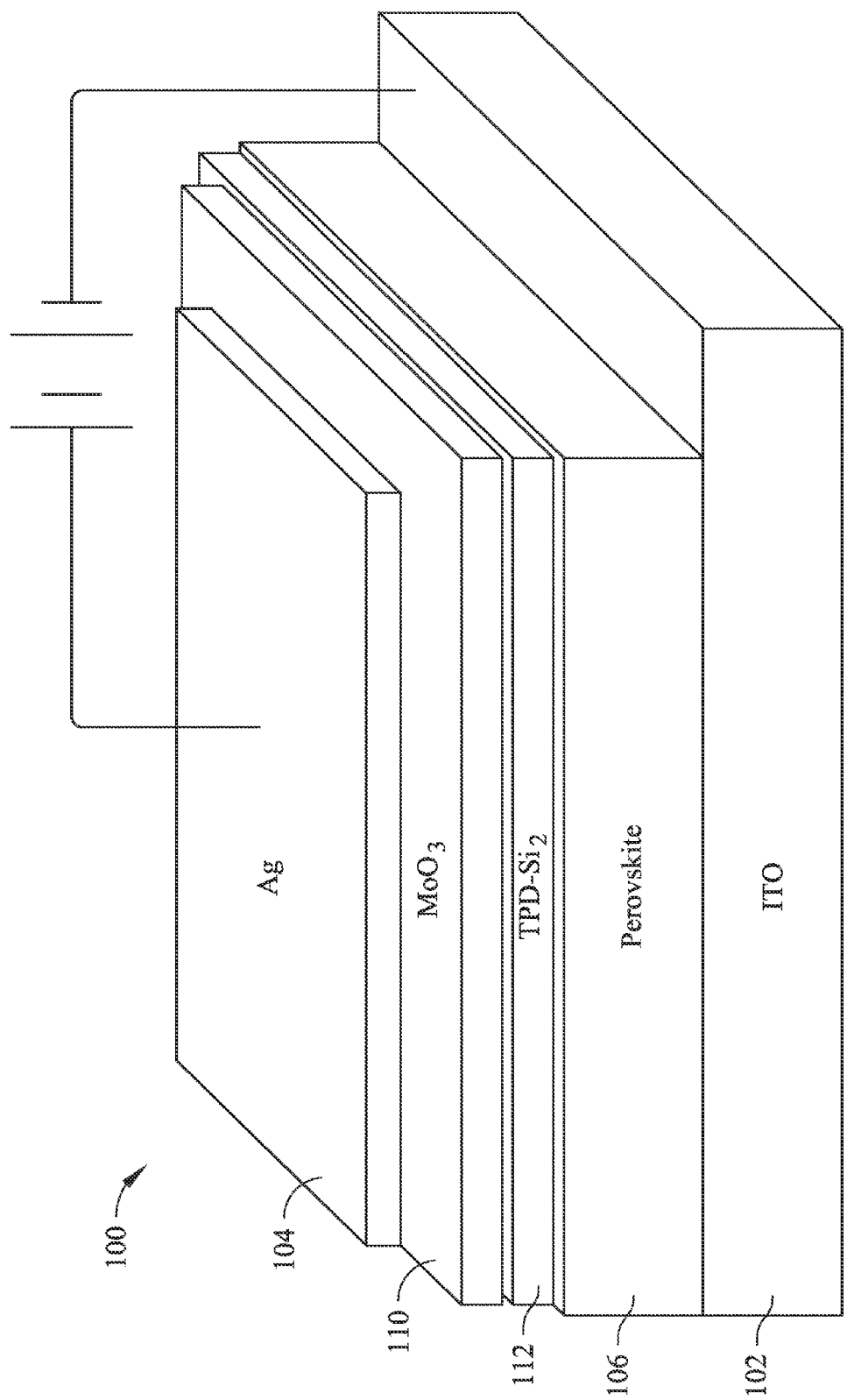
Figure 2:
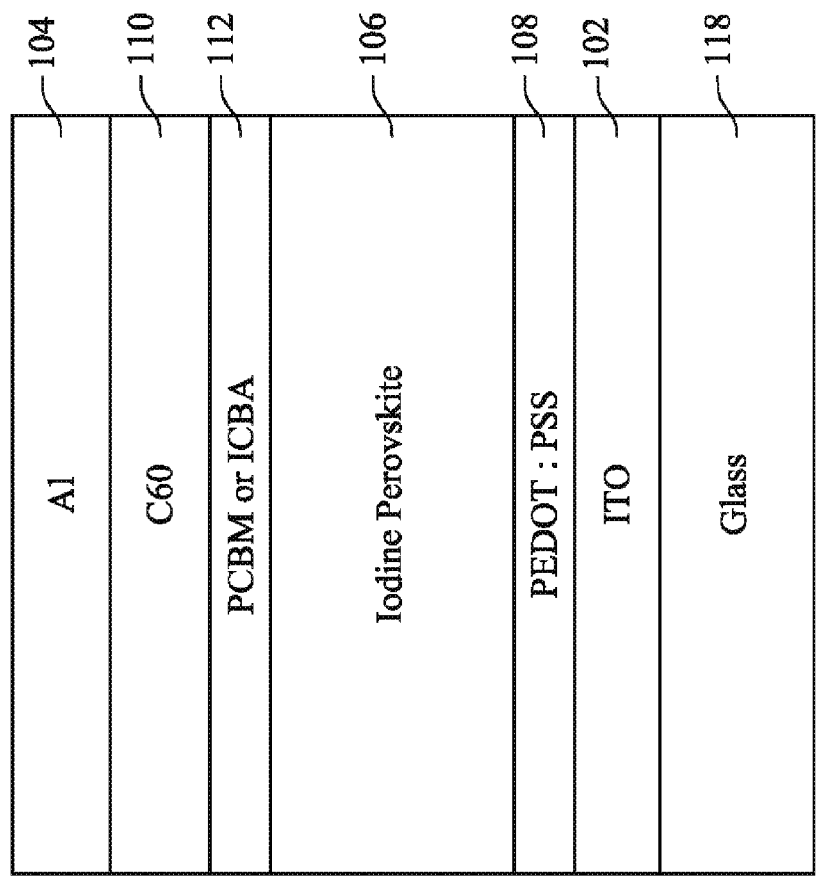

FIGS. 1A through 2 illustrate one implementation of the structure and operating principle of a halide perovskite semiconductor device 100. In implementations, a semiconductor device 100 can include devices such as photovoltaic devices, light emitting diodes, photodetectors, transistors, radiation sensors, solar cells, memristors, and so forth. As shown in FIGS. 1A through 2, the semiconductor device 100 structure includes a cathode layer 102, an anode layer 104, and a halide perovskite layer 106 disposed between the cathode layer 102 and the anode layer 104. In some implementations, also shown in FIGS. 1A through 2, the semiconductor device 100 may include a first buffer layer 108, a second buffer layer 110, and layer 112 (e.g., a single layer of fullerenes, a mixture of fullerenes, a stacking layer of fullerenes (shown in FIG. 2)), and/or other material layers.

As shown in FIGS. 1A through 2, the semiconductor device 100 can include a cathode layer 102 and an anode layer 104. The cathode layer 102 functions as a cathode, which can include an electrode from which a conventional current leaves a polarized electrical device. The anode layer 104 can include an anode, which can include an electrode through which positive electric charge flows into a polarized electrical device, such as the semiconductor device 100. FIG. 1A illustrates one embodiment including an anode layer 104 (e.g., ITO) configured to be disposed on a glass layer 118 and/or substrate and a cathode layer 102 (e.g., Al layer, Ag layer) configured to be a top layer (e.g., distal from the glass layer 118 and/or substrate). FIG. 1B illustrates an embodiment including an inverted device configuration with a cathode layer 102 (e.g., ITO layer) configured to be disposed on a glass layer 118 and/or substrate and an anode layer 104 (e.g., Ag layer) configured to be a top layer (e.g., distal from the glass layer 118 and/or substrate). In some implementations, the bottom layer (e.g., proximate to the glass layer 118 and/or substrate) can function as a transparent electrode (e.g., an ITO layer), and the top layer (e.g., distal from the glass layer 118 and/or the substrate) can function as an opaque electrode (e.g., an Al or an Ag layer).

In some specific embodiments, (shown in FIG. 1A), the cathode layer 102 can include an Al layer and/or a Ag layer that functions as a cathode, and the anode layer 104 can include an indium-tin oxide (ITO) layer that functions as an anode. In other specific embodiments (shown in FIG. 1B), the cathode layer 102 can include an indium-tin oxide (ITO) layer that functions as a cathode, and the anode layer 104 can include an aluminum layer that functions as an anode. Other materials may also be used to form the cathode layer 102, such as calcium, magnesium, lithium, sodium, potassium, strontium, cesium, barium, iron, cobalt, nickel, copper, silver, zinc, tin, samarium, ytterbium, chromium, gold, graphene, an alkali metal fluoride, an alkaline-earth metal fluoride, an alkali metal chloride, an alkaline-earth metal chloride, an alkali metal oxide, an alkaline-earth metal oxide, a metal carbonate, a metal acetate, and/or a combination of two or more of the above materials. Further, other materials may be used to form the anode layer 104 (or a transparent electrode), such as fluorine-doped tin oxide (FTO), aluminum-doped zinc oxide (AZO), antimony-tin mixed oxide (ATO), a conductive polymer, a network of metal nanowire, a network of carbon nanowire, nanotube, nanosheet, nanorod, carbon nanotube, silver nanowire, or graphene. In some embodiments, the cathode layer 102 can be formed first (e.g., disposed on a glass layer 118 or other substrate) while the anode layer 104 is formed last (e.g., a cathode layer 102 is formed on a glass layer 118 and the anode layer 104 is formed last on a second buffer layer 110). In another embodiment, the anode layer 104 can be formed first while the cathode layer 102 is formed last (e.g., an anode layer 104 is formed on a glass layer 118 and the cathode layer 102 is formed last on a second buffer layer 110). In the example shown in FIG. 1A, the anode layer 104 can be formed before the cathode layer 102 is formed, while the example illustrated in FIG. 1B illustrates the cathode layer 102 formed previous to formation of the anode layer 104 on the second buffer layer 110.

The semiconductor device 100 can include an active layer 106, which can include perovskite layer 106. In implementations, the active layer 106 serves to absorb light. In one specific example, an active layer 106 can be configured to absorb light having a wavelength in a first predetermined range, and the anode layer 104 may be transparent to light having a wavelength in a second predetermined range, the second predetermined range overlapping the first predetermined range in a third predetermined range. In this specific example, the semiconductor device 100 may have a high resistivity when not illuminated by any light and may have a low resistivity when illuminated by light having a wavelength in the third predetermined range. In an embodiment, the active layer 106 can include a perovskite layer 106 (e.g., a halide perovskite device), which can function as a photovoltaic material and include a photovoltaic perovskite material. The perovskite layer 106 can be disposed between the cathode layer 102 and the anode layer 104. In implementations, the perovskite layer 106 can include a continuous perovskite film that has been formed by the interdiffusion of solution-deposited lead (II) iodide ($PbI_2$) and methylammonium halide ($CH_3NH_3X$, where X can include Cl, Br, I, and/or a mixed halide) stacked pre-cursor layers. In these implementations, the stacked pre-cursor layers can subsequently be annealed to facilitate interdiffusion between the layers. The resulting high quality perovskite film allows the fabrication of leakage-free photovoltaic devices and a high PCE of 15-17%.

In other embodiments, the active layer 106 can include at least one of polyvinyl carbazole (PVK), poly(3-hexylthiophene) (P3HT), poly[4,8-bis-(2-ethyl-hexylthiophene-5-yl)-benzo[1,2-b:4,5-b']dithiophene-2,6-diyl]-alt-[2-(2'-ethyl-hexanoyl)-thieno[3,4-b]thiophen-4,6-diyl (PBDTTT-CT), phthalocyanine complex, a porphyrin complex, a polythiophene (PT), a derivative of polythiophene, a polycarbazole, a derivative of polycarbazole, a poly(p-phenylene vinylene) (PPV), a derivative of poly(p-phenylene vinylene), a polyfluorene (PF), a derivative of polyfluorene, a cyclopentadithiophene-based polymer, a benzodithiophene (BDT)-based polymer, poly(3-octylthiophene) (P3OT), poly(3-hexyloxythiophene) (P3DOT), poly(3-methylthiophene) (PMeT), poly(3-dodecylthiophene) (P3DDT), poly(3-dodecylthienylenevinylene) (PDDTV), poly(3,3 dialkylquarterthiophene) (PQT), poly-dioctyl-fluorene-co-bithiophene (F8T2), poly-(2,5,-bis(3-alkylthiophene-2-yl)thieno[3,2-b] thiophene) (PBTTT-C12), poly[2,7-(9,9'-dihexylfluorene)-alt-2,3-dimethyl-5,7-dithien-2-yl-2,1,3-benzothiadiazole] (PFDDTBT), poly{[2,7-(9,9-bis-(2-ethylhexyl)-fluorene)]alt-[5,5-(4,7-di-20-thienyl-2,1,3-benzothiadiazole)]} (BisEH-PFDTBT), poly{[2,7-(9,9-bis-(3,7-dimethyl-octyl)-fluorene)]-alt-[5,5-(4,7-di-20-thienyl-2,1,3-benzothiadiazole)]} (BisDMOPFDTBT), poly[N-9''-hepta-decanyl-2,7-carbazole-alt-5,5-(4',7'-di-2-thienyl-2',1',3'benzothiadiazole)] (PCDTBT), and/or a combination of at least two of the above materials.

Additionally, the semiconductor device 100 may include a trapping layer 112, a first buffer layer 108, and/or a second buffer layer 110. The trapping layer 112, the first buffer layer 108, and/or the second buffer layer 110 can be disposed between the active layer 106 and the cathode layer 102 and/or between the active layer 106 and the anode layer 104. In implementations, the trapping layer 112 can function as a carrier trapping layer (hole transporting/electron blocking layer) which can include at least one of zinc oxide (ZnOx), titanium oxide (TiOx), tin oxide (SnOx), zinc sulfide (ZnS), cadmium sulfide (CdS), lead sulfide (PbS), iron sulfide (FeS), iron pyrite (FeS2), cadmium selenide (CdSe), lead selenide (PbSe), cadmium telluride (CdTe), lead telluride (PbTe), Si, Ge, InAs, InSb, $Pb_{1-x}Sn_xTe$, $Hg_{1-x}CdxTe$, InAsSb, InNSb, InBiTe, InTlSb, InAs/GaInSb super lattice, HgTe/CdTe super lattice, graphene quantum dots, carbon nanotubes, and/or fullerene. Additionally, the trapping layer 112 may include organic electron trapping particles, which further include at least one of a fullerene, a derivative of fullerene, a perylene derivative, a 2,7-dicyclohexyl benzo, phenanthroline derivative, a 1,4-diketo-3,6-dithienylpyrrolo[3,4-c]pyrrole (DPP) derivative, a tetracyanoquinodimethane (TCNQ) derivative, indene-C60 bisadduct ([60]ICBA), indene-C70 bisadduct ([70]ICBA), a poly(p-pyridyl vinylene) (PPyV) derivative, a 9,9'-bifluorenylidene (99BF) derivative, a benzothiadiazole (BT) derivative, [6,6]-phenyl C61-butyric acid methy ester (PCBM), [6,6]-phenyl C61-butyric acid methyl ester (PC70BM), [6,6]-(4-fluoro-phenyl)C61-butyric acid methyl ester (FPCBM), carbon 60 (C60), carbon 70 (C70), carbon nanotubes (CNT), a carbon onion, and/or a combination of two or more of the above materials. In some implementations, the trapping layer 112 may be integrated into the first buffer layer 108 and/or the second buffer layer 110. In a specific example, a second buffer layer 110 can include a double fullerene layer (e.g., [6,6]-phenyl-C61-butyric acid methyl ester (PCBM) and indene-C60 bisadduct (ICBA)) disposed between the active layer 106 and the anode layer 104.

The first buffer layer 108 and/or the second buffer layer 110 can be formed on at least one side (e.g., anode side and/or the cathode side) of the perovskite layer 106 and can function to passivate the perovskite surface and/or grain boundaries. In embodiments, the first buffer layer 108 and/or the second buffer layer 110 may include at least one of an organic material, self-assembled monolayers (SAMs), poly(3,4-ethylenedioxithiophene) (PEDOT) doped with poly(styrene sulfonicacid) (PSS), 4,4'bis[(ptrichlorosilylpropylphenyl) phenylamino]biphenyl (TPD-$Si_2$), poly(3-hexyl-2,5-thienylene vinylene) (P3HTV) and C60, copper phthalocyanine (CuPc), poly[3,4-(1hydroxymethyl) ethylenedioxythiophene] (PHEDOT), n-dodecylbenzenesulfonic acid/hydrochloric acid-doped poly(aniline) nanotubes (a-PANIN)s, poly(styrenesulfonic acid)-graft-poly(aniline) (PSSA-g-PANI), poly[(9,9-dioctylfluorene)-co-N-(4-(1-methylpropyl)phenyl)diphenylamine] (PFT), 4,4'bis[(p-trichlorosilylpropylphenyl)phenylamino]biphenyl (TSPP), 5,5'-bis [(ptrichlorosilylpropylphenyl)phenyl amino]-2,20-bithiophene (TSPT), N-propyltriethoxysilane, 3,3,3-trifluoropropyltrichlorosilane or 3-aminopropyltriethoxysilane, $V_2O_5$, VOx, $MoO_3$, $WO_3$, $ReO_3$, NiOx, AgOx/PEDOT:PSS, $Cu_2O$, CuSCN/P3HT, and/or Au nanoparticles.

In embodiments, the second buffer layer 110 may include at least one of an alkali metal compound, a metal oxide, an organic material, self-assembled mono layers (SAMs), LiF, CsF, $LiCoO_2$, $Cs_2CO_3$, TiOx, $TiO_2$ nanorods (NRs), ZnO, ZnO nanorods (NRs), ZnO nanoparticles (NPs), ZnO, $Al_2O_3$, CaO, bathocuproine (BCP), copper phthalocyanine (CuPc), pentacene, pyronin B, [6,6]-phenyl C61-butyric acid methyl ester (PCBM), [6,6]-phenyl C61-butyric acid methyl ester (PC70BM), pentadecafluorooctyl phenyl-C60-butyrate (F-PCBM), C60, C60/LiF, ZnO NRs/PCBM, ZnO/cross-linked fullerene derivative (C-PCBSD), single walled carbon nanotubes (SWCNT), poly(ethylene glycol) (PEG), poly (dimethylsiloxaneblock-methyl methacrylate) (PDMS-b-PMMA), polar polyfluorene (PF-EP), polyfluorene bearing lateral amino groups (PFN), polyfluorene bearing quaternary ammonium groups in the side chains (WPF-oxy-F), polyfluorene bearing quaternary ammonium groups in the side chains (WPF-6-oxy-F), fluorene alternating and random copolymer bearing cationic groups in the alkyl side chains (PFNBr- DBTI5), fluorene alternating and random copolymer bearing cationic groups in the alkyl side chains (PFPNBr), or poly (ethylene oxide) (PEO). In one specific embodiment, the second buffer layer 110 includes at least one layer of C60, PCBM, and/or ICBA.

In one specific embodiment, a semiconductor device 100 includes a structure including a cathode layer 102 including Indium-Tin oxide formed on a glass layer 118, a first buffer layer 108 including poly(3,4-ethylenedioxythiophene) poly (styrenesulphonate) (PEDOT:PSS) disposed on the cathode layer 102, an active layer 106 and a perovskite layer 106 including $MAPbI_3$ (e.g., iodine perovskite) formed on the first buffer layer 108, a trapping layer 112 and second buffer layer 110 including [6,6]-phenyl-C61-butyric acid methyl ester (PCBM with about a 20 nm thickness) or indene-Cx bisadduct (ICBA), C60 (e.g., about a 20 nm thickness), and 2,9-dimethyl-4,7-diphenyl-1,10-phenanthroline (BCP, with about a 7 nm thickness) formed on the active layer 106, and an anode layer 104 including aluminum (with a thickness of about 100 nm) formed on the trapping layer 112 and second buffer layer 110. In this specific embodiment, the perovskite layer 106 precursors may be formed on the semiconductor device 100 separately or as a pre-mixed precursor. This configuration can result in a continuous, pin-hole free perovskite layer with a film thickness variation often less than 20 nm. After an annealing process, the semiconductor device 100 results in a layered structure with penetration of Pb and I across the whole perovskite layer. The depth profile of Pb and I may include a graded composition with increased Pb and I toward the PEDOT:PSS side. The perovskite-based semiconductor device 100 can function as a highly sensitive UV and visible light photo detector. In another specific embodiment, the semiconductor device 100 can include an anode layer 104 (e.g., Al) and a first buffer layer 108 including a layer of ITO, a perovskite layer 106 on the anode layer 104 and the first buffer layer 108, a trapping layer 112 including $TPD-Si_2$ disposed on the perovskite layer 106, a second buffer layer 110 including $MoO_3$ disposed on the trapping layer 112, and a cathode layer 102 (e.g., ITO) disposed on the trapping layer 112.

Some halide perovskite materials can only absorb light up to about 800 nm, and thus may not have light detection ability in the near-IR range. In one implementation, a quantum dots (QDs) halide perovskite hybrid semiconductor device 100 can extend light detection to near-IR range. In this implementation, the semiconductor device 100 can include an active layer 106 including quantum dots, which can be operated as sensitizers while the halide perovskite layer 106 can serve as a functional interface from which to extract carriers and also as bridges to transfer carriers between quantum dots. In these implementations, PbS quantum dots can be integrated into a first buffer layer 108 and/or a second buffer layer 110 including a PCBM to form a PCBM matrix. This specific semiconductor device 100 can function as a highly sensitive board wavelength photo detector.

Example Processes

Figure 3A:
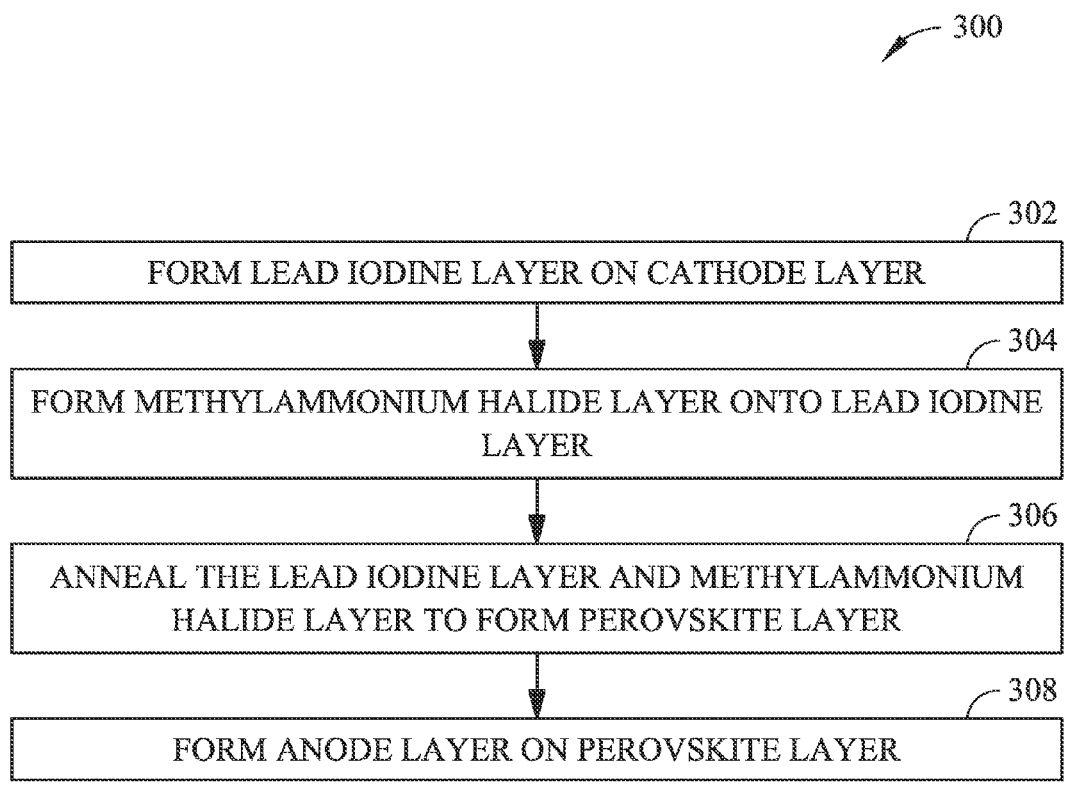
FIG. 3A is a flow diagram illustrating an example process for fabricating a semiconductor device with an active layer that includes a perovskite layer including an interdiffused and annealed lead (II) iodide ($PbI_2$) film and methylammonium halide ($CH_3NH_3X$) film, such as the semiconductor device illustrated in FIGS. 1A through 2.
Figure 3B:
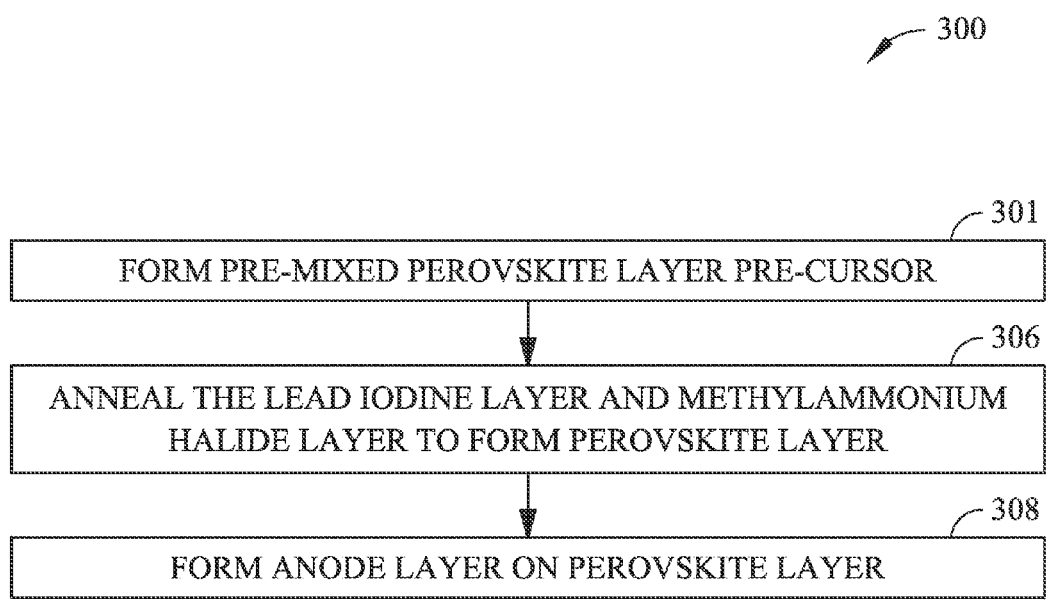
FIG. 3B is a flow diagram illustrating an example process for fabricating a semiconductor device with an active layer that includes a pre-mixed perovskite layer pre-cursor including a lead (II) iodide ($PbI_2$) film and methylammonium halide ($CH_3NH_3X$) film, such as the semiconductor device illustrated in FIGS. 1A through 2.
Figure 4:
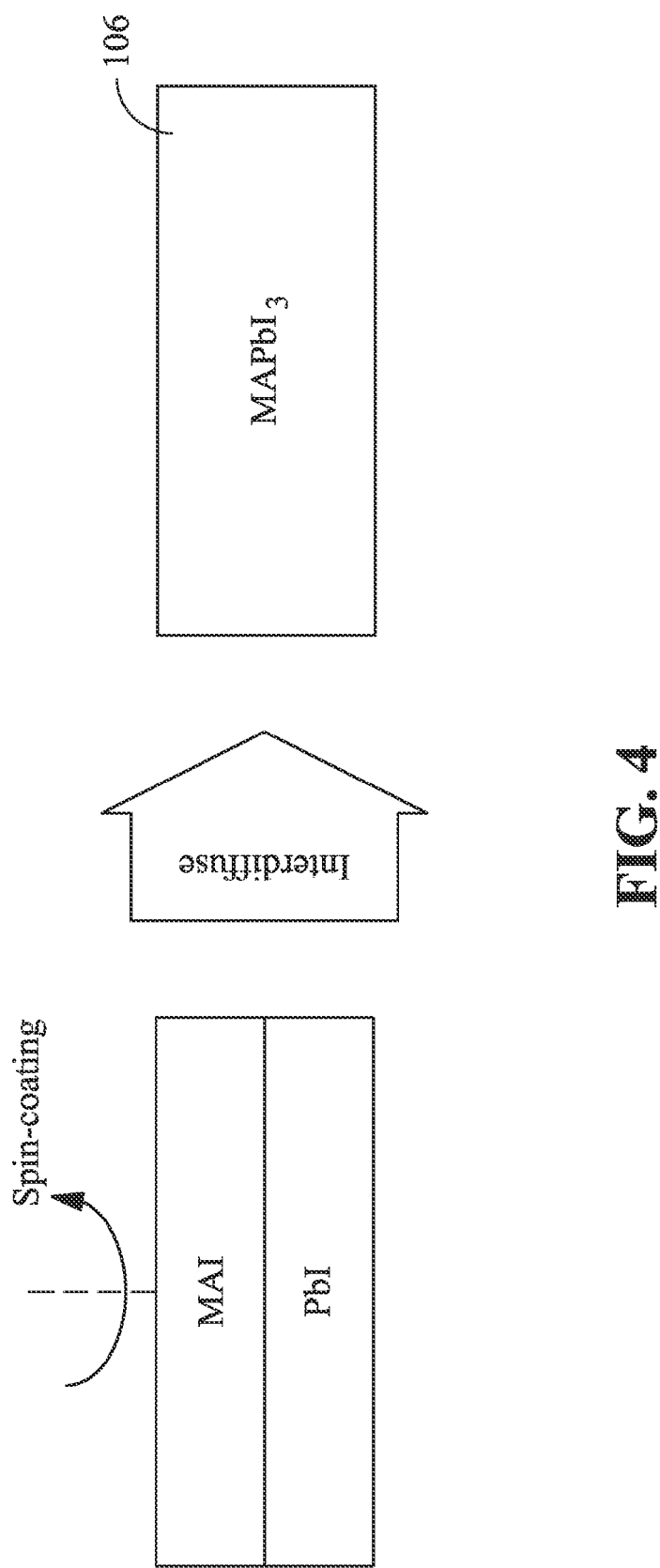
FIG. 4 is a process view illustrating formation of an interdiffused and annealed lead (II) iodide ($PbI_2$) film and methylammonium halide ($CH_3NH_3X$) film, resulting in the perovskite layer shown in FIGS. 1A through 2, in accordance with the processes shown in FIG. 3A and/or FIG. 3B.

FIGS. 3A and 3B illustrate example processes 300 that employ techniques to fabricate a perovskite photo detector, such as the semiconductor device 100 shown in FIGS. 1A through 2. FIG. 4 illustrates a process for forming a lead iodine layer, forming a methylammonium halide layer, and/or annealing the lead iodine layer and the methylammonium halide layer to form a perovskite semiconductor device 100.

Figure 5:
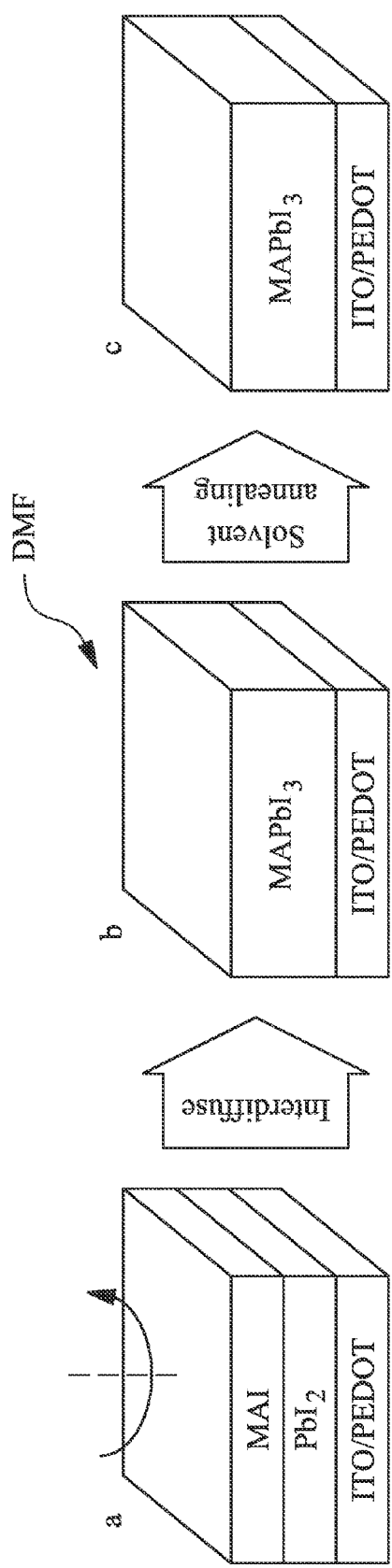
FIG. 5 is a process view illustrating formation of an interdiffused solvent-annealed lead (II) iodide ($PbI_2$) film and methylammonium halide ($CH_3NH_3X$) film, resulting in the perovskite layer shown in FIGS. 1A through 2, in accordance with the processes shown in FIG. 3A and/or FIG. 3B.

The processes 300 include methods for forming continuous and/or compact lead iodine perovskite ($MAPbI_3$) films by the interdiffusion of formed and/or spin-coated layers of stacked $PbI_2$ and MAI. The resulting high quality perovskite film allows the fabrication of leakage-free photovoltaic devices and a high PCE of 15-17%. A lead iodine ($PbI_2$) layer is formed on a cathode layer (Block 302), and a methylammonium halide (MAI) layer is formed on the lead iodine layer (Block 304). In other embodiments and as shown in FIGS. 3B and 5, the precursors (e.g., MAI and $PbI_2$) are pre-mixed prior to applying and/or spin-coating the perovskite film on a first buffer layer 108, a cathode layer, and/or an anode layer (Block 301). It is contemplated that other lead-based layers can be formed (e.g., $PbX_2$, where X can be Br, Cl, etc.). In a specific implementation, $PbI_2$ and MAI can be dissolved in dimethylformamide (DMF) and 2-propanol, respectively, as precursor solutions at varied concentrations. The respective precursor solutions can then be formed and/or spun onto a substrate, such as a glass layer 118 and/or a first buffer layer 108. In some implementations, the glass layer 118 can include a first buffer layer 108, such as poly(3,4-ethylenedioxythiophene) poly(styrenesulphonate) (PEDOT:PSS). Additionally, the glass layer 118 may be covered with a cathode layer 102, such as indium tin oxide (ITO). In other implementations, the glass layer 118 may include an anode layer 104 instead of a cathode layer 102, such as an aluminum layer. In some implementations, and as shown in FIG. 4, the $PbI_2$ layer can be formed first and disposed under the MAI layer. In other implementations the MAI layer may be formed first and disposed under the $PbI_2$ layer. In some embodiments, a supersaturated hot solution of $PbI_2$ can be used for quick drying to obtain a pin-hole free and conformal $PbI_2$ layer on a PEDOT:PSS layer and/or a glass layer 118. Since $PbI_2$ has relatively low solubility in 2-propanol, the spin-coating of MAI will not wash off $PbI_2$.

In one implementation for forming a lead iodide ($PbI_2$) layer and a methylammonium halide (MAI) layer, a $CH_3NH_3I$ precursor is synthesized. In a specific example, a concentrated aqueous solution of hydroiodic acid (HI) (e.g., 15.0 mL, 57 wt % in water) can be reacted with methylamine ($CH_3NH_2$) (e.g., 13.5 mL, 40 wt % in aqueous solution) at 0° C. for 2 hours with constant stirring under a nitrogen atmosphere. Methylammonium can be crystalized by removing the solvent using a rotary evaporator. In this specific example, the resulting white powder can be washed with diethyl ether three times and dried in a vacuum overnight.

In a specific implementation (e.g., for fabricating a solar cell), $PbI_2$ and/or MAI can be dissolved in DMF and 2-propanol with varying concentrations from about 130 mg/ml to about 450 mg/ml for $PbI_2$, and from about 17.5 mg/ml to about 50 mg/ml for MAI, respectively. In another specific implementation (e.g., for fabricating a photodetector), concentrations can include about 400-800 mg/ml for PbI2 and about 15-60 mg/ml for MAI. In some implementations, the $CH_3NH_3X$ and $PbX_2$ precursor mixture solutions in dimethylformamide (DMF) can include varied $PbI_2/CH_3NH_3I$ precursor molar ratios (defined as a precursor ratio) from about 0.35 to about 1.5. The thickness of the $CH_3NH_3PbI_3$ films (e.g., from about 80 nm to about 5,000 nm) may be determined by varying the concentration of the precursor solutions. In one specific example, the precursor solutions can have a precursor ratio between about 0.5 to about 0.9, which can result in an iodine perovskite thickness of between about 200-500 nm. In some embodiments, a thicker perovskite film of about 1,000-8,000 nm may be used for mixed halide perovskites. In some implementations, the temperature of the precursor solution(s) can be generally above room temperature. A high concentration precursor solution may be used to form a relatively thicker perovskite film.

In this specific embodiment, both solutions can be heated at about 100° C. for approximately 10 min before use to ensure that both the MAI and PbI$_2$ can be fully dissolved. The PbI$_2$ solution can be formed and/or spun on a PEDOT:PSS layer or other substrate at about 70° C. at 6,000 round per second (rpm) for 35 seconds. Then, the PbI$_2$ film can be quickly transferred onto a hot plate and dried at about 70° C. The MAI solution can be spun on top of the dried PbI$_2$ film at 6,000 rpm for 35 seconds at room temperature in order to form a film with thickness ranging from about 70-320 nm. The MAI layer thickness may depend on the precursor solution concentration as well as the thickness of the underlying PbI$_2$ layer. The spin coated PbI$_2$ and MAI stacking films may then be dried at about 100° C. from one to three hours. In this specific implementation, a PCBM layer (e.g., dissolved in Dichlorobenzene (DCB), 2 wt %) may be spun on the formed perovskite layers after cooling to room temperature.

The lead iodine layer and the methylammonium halide layer are then annealed to form an interdiffused perovskite layer (Block 306). In implementations, the PbI$_2$ and MAI layers can be solvent annealed and/or thermally annealed for varied durations. In one example of thermal annealing, the PbI$_2$ and MAI layers can be annealed at a temperature of about 80-120° C. for about 30-180 mins. FIG. 5 illustrates one specific example of a solvent annealing process. In this specific example of solvent annealing, around 10 μL of DMF solvent can be added proximate to the PbI$_2$ and MAI layers during the thermal annealing process such that the DMF vapor can contact the perovskite layer. The DMF vapor may penetrate into the perovskite film and facilitate the growth of crystalline domains. The resulting annealed perovskite layer 106 is generally continuous and pinhole-free across the whole surface. In contrast, bilayer MAPbI$_3$ films formed and spun from premixed PbI$_2$ and MAI blend solutions generally may be non-uniform with many microstructures on the surface. In one specific embodiment, a PbI$_2$, MAI, and PCBM layer can be annealed at 100° C. for one hour to let the PCBM crystalize and/or diffuse into a resulting perovskite layer. In another specific embodiment, a mixed halide perovskite layer may be annealed for about 2 hours. The perovskite layer may be finished forming additional layers (e.g, a second buffer layer 110, a trapping layer 112, etc.). In a specific example, a fullerene layer can be formed using thermal evaporating (e.g., C60 (20 nm), BCP (8 nm)).

An anode layer is then formed on the perovskite layer (Block 308). In implementations, the anode layer can be formed on the perovskite layer, second buffer layer 110, and/or trapping layer 112 using processes such as physical vapor deposition. In a specific embodiment, an aluminum anode can be formed to a thickness of about 100 nm. In another specific embodiment, the semiconductor device 100 area can be defined to be the overlap of the cathode layer 102 (e.g., ITO) and anode layer 104 (e.g., an aluminum electrode) to be about 6 mm$^2$.

CONCLUSION

Although the subject matter has been described in language specific to structural features and/or process operations, it is to be understood that the subject matter defined in the appended claims is not necessarily limited to the specific features or acts described above. Rather, the specific features and acts described above are disclosed as example forms of implementing the claims.

What is claimed is:

1. A semiconductor device, comprising:
a cathode layer;
an anode layer; and
an active layer disposed between the cathode layer and the anode layer, where the active layer includes a perovskite layer including an interdiffused and annealed lead(II) iodide (PbI$_2$) film and methylammonium halide (CH$_3$NH$_3$X) film, wherein the perovskite layer includes a graded composition with increased Pb and I toward one of the cathode layer or anode layer, wherein X includes at least one of Cl, Br, or I.

2. The semiconductor device of claim 1, wherein the perovskite layer includes organometal trihalide perovskite (CH$_3$NH$_3$PbI$_2$X) where X includes at least one of Cl, Br, or I.

3. The semiconductor device of claim 1, further comprising:
a first buffer layer disposed between the active layer and the cathode;
a carrier trapping layer disposed between the active layer and the first buffer layer; and
a second buffer layer disposed between the active layer and the anode, the first buffer layer having a higher electron conductivity than the second buffer layer, the second buffer layer having a higher hole conductivity than the first buffer layer.

4. The semiconductor device of claim 1, wherein the active layer includes at least one of polyvinyl carbazole (PVK), poly(3-hexylthiophene) (P3HT), poly[4,8-bis-(2-ethyl-hexylthiophene-5-yl)-benzo[1,2-b:4,5-b']dithiophene-2,6-diyl]-alt-[2-(2'-ethyl-hexanoyl)-thieno[3,4-b]thiophen-4,6-diyl (PBDTTT-CT), phthalocyanine complex, a porphyrin complex, a polythiophene (PT), a derivative of polythiophene, a polycarbazole, a derivative of polycarbazole, a poly(p-phenylene vinylene) (PPV), a derivative of poly(p-phenylene vinylene), a polyfluorene (PF), a derivative of poly fluorene, a cyclopentadithiophene-based polymer, a benzodithiophene (BDT)-based polymer, a polythiophene, a derivative of polythiophene, a polycarbazole, a derivative of poly carbazole, poly(3-octylthiophene) (P3OT), poly(3-hexyloxythiophene) (P3DOT), poly(3-methylthiophene) (PMeT), poly(3-dodecylthiophene) (P3DDT), poly(3-dodecylthienylenevinylene) (PDDTV), poly(3,3 dialkylquarterthiophene) (PQT), polydioctyl-fluorene-co-bithiophene (F8T2), poly-(2,5,-bis(3-alkylthiophene-2-yl)thieno[3,2-b]thiophene) (PBTTT-C12), poly[2,7-(9,9'-dihexylfluorene)-alt-2,3-dimethyl-5,7-dithien-2-yl-2,1,3-benzothiadiazole] (PFDDTBT), poly{[2,7-(9,9-bis-(2-ethylhexyl)-fluorene)]alt-[5,5-(4,7-di-20-thienyl-2,1,3-benzothiadiazole)]} (BisEH-PFDTBT), poly{[2,7-(9,9-bis-(3,7-dimethyl-octyl)-fluorene)]-alt-[5,5-(4,7-di-20-thienyl-2,1,3-benzothiadiazole)]} (BisDMOPFDTBT), poly[N-9'''-hepta-decanyl-2,7-carbazole-alt-5,5-(4',7'-di-2-thienyl-2',1',3'-benzothiadiazole)] (PCDTBT), or a combination of at least two of the above materials.

5. The semiconductor device of claim 1, wherein the cathode includes at least one of aluminum, calcium, magnesium, lithium, sodium, potassium, strontium, cesium, barium, iron, cobalt, nickel, copper, silver, zinc, tin, samarium, ytterbium, chromium, gold, graphene, an alkali metal fluoride, an alkaline-earth metal fluoride, an alkali metal chloride, an alkaline-earth metal chloride, an alkali metal oxide, an alkaline-earth metal oxide, a metal carbonate, a metal acetate, or a combination of at least two of the above materials.

6. The semiconductor device of claim 1, wherein the anode includes at least one of indium tin oxide (ITO), fluorine-doped tin oxide (FTO), aluminum-doped zinc oxide (AZO), antimony-tin mixed oxide (ATO), a conductive polymer, a network of metal nanowire, a network of carbon nanowire, nanotube, nanosheet, nanorod, carbon nanotube, silver nanowire, or graphene.

7. The semiconductor device of claim 1, wherein the second buffer layer includes at least one of LiF, CsF, $LiCoO_2$, $CS_2CO_3$, $TiO_x$, $TiO_2$ nanorods (NRs), ZnO, ZnO nanorods (NRs), ZnO nanoparticles (NPs), ZnO, $Al_2O_3$, CaO, bathocuproine (BCP), copper phthalocyanine (CuPc), pentacene, pyronin B, [6,6]-phenyl C61-butyric acid methyl ester (PCBM), [6,6]-phenyl C61-butyric acid methyl ester (PC70BM), pentadecafluorooctyl phenyl-C60-butyrate (F-PCBM), C60, C60/LiF, ZnO NRs/PCBM, ZnO/cross-linked fullerene derivative (C-PCBSD), single walled carbon nanotubes (SWCNT), poly(ethylene glycol) (PEG), poly (dimethylsiloxaneblock-methyl methacrylate) (PDMS-b-PMMA), polar polyfluorene (PF-EP), polyfluorene bearing lateral amino groups (PFN), polyfluorene bearing quaternary ammonium groups in the side chains (WPF-oxy-F), polyfluorene bearing quaternary ammonium groups in the side chains (WPF-6-oxy-F), fluorene alternating and random copolymer bearing cationic groups in the alkyl side chains (PFNBr-DBTI5), fluorene alternating and random copolymer bearing cationic groups in the alkyl side chains (PFPNBr), or poly (ethylene oxide) (PEO).

8. The semiconductor device of claim 1, wherein the active layer absorbs light having a wavelength in a first predetermined range.

9. The semiconductor device of claim 3, wherein the carrier trapping layer includes at least one of zinc oxide ($ZnO_x$), titanium oxide ($TiO_x$), tin oxide ($SnO_x$), zinc sulfide (ZnS), cadmium sulfide (CdS), lead sulfides (PbS), iron sulfide (FeS), iron pyrite ($FeS_2$), cadmium selenide (CdSe), lead selenide (PbSe), cadmium telluride (CdTe), lead telluride (PbTe), Si, Ge, InAs InSb, $Pb_{1-x}SnxTe$, $Hg_{1-x}Cd_xTe$, InAsSb, InNSb, InBiTe, or InTlSb.

10. The semiconductor device of claim 3, wherein the carrier trapping layer includes at least one of an InAs/GaInSb super lattice, a HgTe/CdTe super lattice, graphene quantum dots, a carbon nanotube, or fullerene.

11. The semiconductor device of claim 3, wherein the first buffer layer includes at least one of an organic material or a self-assembled monolayer (SAM).

12. The semiconductor device of claim 3, wherein the first buffer layer includes at least one of poly(3,4-ethylene-dioxithiophene) (PEDOT) doped with poly(styrene sulfonicacid) (PSS), 4,4'bis[(ptrichlorosilylpropylphenyl)phenylamino]biphenyl (TPD-$Si_2$), poly(3-hexyl-2,5-thienylene vinylene) (P3HTV) and C60, copper phthalocyanine (CuPc), poly[3,4-(1hydroxymethyl) ethylenedioxythiophene] (PHE-DOT), n-dodecylbenzenesulfonic acid/hydrochloric acid-doped poly(aniline) nanotubes (a-PANIN)s, poly(styrene-sulfonic acid)-graft-poly(aniline) (PSSA-g-PANI), poly[(9, 9-dioctylfluorene)-co-N-(4-(1-methylpropylfphenylfdiphenylamine] (PFT), 4,4'bis[(p-trichlorosilylpropylphenyl)phenylamino]biphenyl (TSPP), 5,5'-bis[(p-trichlorosilylpropylphenyl)phenylamino]-2,20-bithiophene (TSPT), N-propyltriethoxysilane, 3,3,3-trifluoropropyltrichlorosilane or 3-aminopropyltriethoxysilane $V_2O_5$, $VO_x$, $MoO_3$, $WO_3$, $ReO_3$, $NiO_x$, $AgO_x$/PEDOT:PSS, $Cu_2O$, CuSCN/P3HT, or Au nanoparticles.

13. The semiconductor device of claim 3, wherein the second buffer layer includes at least one of an alkali metal compound, a metal oxide, an organic material, or self-assembled mono layers (SAMs).

14. The semiconductor device of claim 3, wherein the carrier trapping layer includes at least one of a fullerene, a derivative of fullerene, a perylene derivative, a 2,7-dicyclo-hexyl benzo, phenanthroline derivative, a 1,4-diketo-3,6-dithienylpyrrolo[3,4-c]pyrrole (DPP) derivative, a tetracy-anoquinodimethane (TCNQ) derivative, indene-C60 bisadduct ([60]ICBA), indene-C70 bisadduct ([70]ICBA), a poly(p-pyridyl vinylene) (PPyV) derivative, a 9,9'-bifluorenylidene (99BF) derivative, a benzothiadiazole (BT) derivative, [6,6]-phenyl C61-butyric acid methyl ester (PCBM), [6,6]-phenyl C61-butyric acid methyl ester (PC70BM), [6,6]-(4-fluoro-phenyl)C61-butyric acid methyl ester (FPCBM), carbon 60 (C60), carbon 70 (C70), carbon nanotube (CNT), a carbon onion, or a combination of two or more of the above materials.

15. The semiconductor device of claim 8, wherein the anode is at least one of transparent or partially transparent to light having a wavelength in a second predetermined range, the second predetermined range overlapping the first predetermined range in a third predetermined range.

16. A process for fabricating a continuous-perovskite photodetector device, comprising:
 forming a pre-mixed perovskite layer pre-cursor on a cathode layer, the pre-cursor including lead iodide ($PbI_2$) and a methylammonium halide ($CH_3NH_3X$), wherein X includes at least one of Cl, Br or I;
 annealing the pre-mixed perovskite layer pre-cursor to form a perovskite layer; and
 forming an anode layer on the perovskite layer,
 wherein the perovskite layer includes a graded composition with increased Pb and I toward one of the cathode layer or anode layer.

17. The process of claim 16, wherein the pre-mixed perovskite layer pre-cursor includes a precursor molar ratio of lead iodine ($PbI_2$) to methylammonium halide of about 0.5 to about 0.9.

18. A process for fabricating a continuous-perovskite photodetector device, comprising:
 forming a lead iodide ($PbI_2$) layer onto a cathode layer covered glass;
 forming a methylammonium halide ($CH_3NH_3X$) layer onto the lead iodine layer, wherein X includes at least one of Cl, Br, or I;
 annealing the lead iodine layer and the methylammonium halide layer to form a perovskite layer; and
 forming an anode layer on the perovskite layer.

19. The process of claim 18, wherein forming an anode layer includes forming an aluminum layer.

20. The process of claim 18, wherein forming a lead iodine ($PbI_2$) layer onto a cathode layer covered glass includes forming a lead iodine ($PbI_2$) layer onto an Indium-Tin-oxide covered glass.

21. The process of claim 18, further comprising forming a PCBM layer onto the perovskite layer.

22. The process of claim 18, wherein annealing the lead iodine layer and the methylammonium halide layer to form a perovskite layer includes:
 annealing the lead iodine layer and the methylammonium halide layer at a temperature of about 80° C. to about 120° C. for about 30 to about 180 minutes to form the perovskite layer.

23. The process of claim 18, wherein the perovskite layer includes a graded composition with increased Pb and I toward one of the cathode layer or anode layer.

* * * * *